US007843205B2

(12) United States Patent
Burns et al.

(10) Patent No.: US 7,843,205 B2
(45) Date of Patent: Nov. 30, 2010

(54) PROCESS MONITOR FOR MONITORING AN INTEGRATED CIRCUIT CHIP

(75) Inventors: Lawrence M. Burns, Laguna Hills, CA (US); Leonard Dauphinee, Irvine, CA (US); Ramon A. Gomez, San Juan Capistrano, CA (US); James Y. C. Chang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/261,833

(22) Filed: Oct. 30, 2008

(65) Prior Publication Data
US 2009/0085597 A1 Apr. 2, 2009

Related U.S. Application Data

(63) Continuation of application No. 10/647,472, filed on Aug. 26, 2003, now Pat. No. 7,449,908, which is a continuation of application No. 10/440,311, filed on May 19, 2003, now Pat. No. 7,309,998.

(60) Provisional application No. 60/430,061, filed on Dec. 2, 2002.

(51) Int. Cl.
*G01R 31/02* (2006.01)

(52) U.S. Cl. ..................................... 324/763

(58) Field of Classification Search ........................ None
See application file for complete search history.

(56) References Cited

U.S. PATENT DOCUMENTS

| 4,159,514 A | 6/1979 | Kakalec |
| 4,354,216 A | 10/1982 | Volta |
| 4,796,142 A | 1/1989 | Libert |
| 5,363,048 A | 11/1994 | Modlin et al. |
| 5,621,355 A | 4/1997 | Williams et al. |
| 5,677,845 A * | 10/1997 | Staver et al. ................ 324/73.1 |
| 5,764,655 A | 6/1998 | Kirihata et al. |
| 5,774,319 A | 6/1998 | Carter et al. |
| 5,781,766 A | 7/1998 | Davis |
| 5,831,446 A | 11/1998 | So et al. |
| 5,939,693 A * | 8/1999 | Roeckner et al. ............ 714/733 |

(Continued)

FOREIGN PATENT DOCUMENTS

JP 07183344 7/1995

OTHER PUBLICATIONS

Allen, P. and Holberg, D., CMOS *Analog Circuit Design*, Saunders College Publishing, 1987, pp. 58-66 and 76-86.
Johns, D. and Martin, K., *Analog Integrated Circuit Design*, John Wiley & Sons, Inc., 1997 pp. 16-39 and 57-60.

*Primary Examiner*—Jermele M Hollington
(74) *Attorney, Agent, or Firm*—Sterne, Kessler, Goldstein & Fox P.L.L.C.

(57) ABSTRACT

A system or apparatus for monitoring an Integrated Circuit (IC) chip includes: a sense circuit at least partially constructed on the IC chip and configured to produce one or more sense signals each indicative of a corresponding process-dependent circuit parameter of the IC chip; and a digitizer module configured to produce, responsive to the one or more sense signals, one or more digitized signals each representative of a corresponding one of the sense signals. A controller is configured to determine a value of one or more of the process-dependent circuit parameters based on one or more of the digitized signals.

20 Claims, 9 Drawing Sheets

U.S. PATENT DOCUMENTS

| | | |
|---|---|---|
| 6,002,356 A | 12/1999 | Cooper |
| 6,040,737 A | 3/2000 | Ranjan et al. |
| 6,088,806 A | 7/2000 | Chee |
| 6,154,715 A | 11/2000 | Dinteman et al. |
| 6,163,862 A | 12/2000 | Adams et al. |
| 6,169,442 B1 | 1/2001 | Meehan et al. |
| 6,239,603 B1 | 5/2001 | Ukei et al. |
| 6,357,025 B1 | 3/2002 | Tuttle |
| 6,369,618 B1 | 4/2002 | Bloodworth et al. |
| 6,476,593 B1 | 11/2002 | Schmal et al. |
| 6,535,013 B2 | 3/2003 | Samaan |
| 6,577,196 B2 | 6/2003 | Hart |
| 6,600,374 B2 | 7/2003 | Nguyen et al. |
| 6,714,036 B2 | 3/2004 | Figueras et al. |
| 6,727,759 B2 | 4/2004 | Nguyen et al. |
| 6,769,081 B1 | 7/2004 | Parulkar |
| 6,785,626 B2 | 8/2004 | Corr |
| 6,853,177 B2 | 2/2005 | Shibayama et al. |
| 6,853,315 B2 | 2/2005 | Schiller et al. |
| 6,894,501 B1 | 5/2005 | Flasck et al. |
| 7,309,998 B2 | 12/2007 | Burns et al. |
| 7,385,418 B2 * | 6/2008 | Speers et al. ................. 714/746 |
| 7,449,908 B2 * | 11/2008 | Burns et al. ................. 324/763 |
| 2002/0160711 A1 | 10/2002 | Carlson et al. |
| 2003/0034838 A1 | 2/2003 | Fanous et al. |
| 2004/0104740 A1 * | 6/2004 | Burns et al. ................. 324/763 |
| 2004/0105033 A1 | 6/2004 | Dauphinee et al. |
| 2004/0108866 A1 | 6/2004 | Burns et al. |
| 2004/0166799 A1 | 8/2004 | Kral |
| 2005/0062491 A1 | 3/2005 | Burns et al. |
| 2005/0130617 A1 | 6/2005 | Burns et al. |

* cited by examiner

OPERATIONAL CIRCUIT

PROCESS MONITOR FOR MONITORING AN INTEGRATED CIRCUIT CHIP

CROSS-REFERENCE TO RELATED APPLICATIONS

This application is a continuation of U.S. application Ser. No. 10/647,472, filed Aug. 26, 2003, now U.S. Pat. No. 7,449,908, which is a continuation of U.S. application Ser. No. 10/440,311, filed May 19, 2003, now U.S. Pat. No. 7,309,998, which claims the benefit of U.S. Provisional Application No. 60/430,061, filed Dec. 2, 2002, each of which is incorporated herein in its entirety by reference.

BACKGROUND OF THE INVENTION

1. Field of the Invention

The present invention relates generally to monitoring an integrated circuit (IC) chip.

2. Related Art

Circuits constructed on an IC chip or substrate are referred to as integrated circuits. Integrated circuits include transistors and resistors, for example. Integrated circuits are fabricated or manufactured in high volume using integrated circuit processes, such as a CMOS process. The integrated circuits may be characterized in terms of various circuit parameters, such as sheet-rho, transistor threshold voltage, and a transistor transconductance parameter, to name but a few.

Process variations can cause unpredictable and undesired variations of the circuit parameters, which can adversely affect circuit performance. In other words, the circuit parameters tend to be process dependent. Thus, it is useful for a manufacturer to be able to quantify or determine the circuit parameters. Accordingly, there is a need to be able to measure and determine process-dependent circuit parameters associated with circuits constructed on an IC chip. A related need is to be able to determine a temperature of the IC chip and/or a power supply voltage of the IC chip.

SUMMARY OF THE INVENTION

The present invention is directed to methods and apparatuses for monitoring an IC chip. The invention provides a way of determining various important circuit parameters, environmental parameters of the IC chip (such as temperature), and/or operational conditions (such as power supply voltage) of the IC chip. The circuit parameters include process-dependent circuit parameters. The invention can determine absolute values of the circuit parameters. From this, the performance of circuits constructed on the IC chip can be evaluated.

An embodiment of the present invention is directed to a sense circuit used in monitoring an IC chip. The sense circuit includes one or more sense elements constructed on the IC chip. The sense elements include diode connected transistors (both NMOS and PMOS) of different sizes and operating currents, and on-chip resistors of different values and types. The sense circuit also includes a switch circuit or matrix that provides different values and types of currents to each of the one or more sense elements. The voltage developed across each of the sense elements provides useful information about how the IC chip was processed.

In a further embodiment, the sense circuit feeds the various sense voltages to a multiplexer (MUX), which presents selected ones of the sense voltages to a digitizer, such as an Analog-to-Digital converter (A/D). The A/D converts each analog voltage to a digital word. Together, the multiplexer and digitizer form a digitizer module. A processor or controller, which may be external to the IC chip, controls the sense circuit and the digitizer module, and processes the various sense data (digital words) produced thereby. The processor determines various circuit parameters of the IC chip based on the digital words.

In an embodiment, a system for monitoring an Integrated Circuit (IC) chip, comprises: a sense circuit at least partially constructed on the IC chip and configured to produce one or more sense signals each indicative of a corresponding process-dependent circuit parameter of the IC chip; a digitizer module configured to produce, responsive to the one or more sense signals, one or more digitized signals each representative of a corresponding one of the sense signals. In a further embodiment, a controller determines a value of one or more of the process-dependent circuit parameters based on one or more of the digitized signals. In even further embodiments, the sense circuit and digitizer produce signals indicative of a temperature and a power supply voltage of the IC chip.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention. In the drawings, like reference numbers indicate identical or functionally similar elements.

DETAILED DESCRIPTION OF THE INVENTION

I. Glossary

CTAT: Constant-To-Absolute-Temperature.
CMOS: Complimentary Metal Oxide Semiconductor.
ADC or A/D: Analog-to-Digital Converter.
DAC or D/A: Digital-to-Analog Converter.
FET: Field Effect Transistor, having a gate terminal (gate), a drain terminal (drain), and a source terminal (source).
IC: Integrated Circuit.
NMOS transistor: N-channel MOS transistor.
PMOS transistor: P-channel MOS transistor (complementary to an N-channel transistor).
PTAT: Proportional-To-Absolute-Temperature.
VT, vt, Vt, VTH or VTH: Represents a gate-to-source (or "gate-source") threshold voltage of a transistor.
Sheet-rho: Sheet Resistance, in units of ohms per square (ohms/square). Resistors may be constructed on an integrated circuit using resistance material, such as polysilicon, configured in multiples of a "unit square" of the material. Typically, a designer may have a choice of constructing a resistor out of a material having low sheet-rho (e.g., 6 ohms/square) or high sheet-rho (e.g., 200 ohms/square). For example, a resistor may be made using a polysilicon high sheet-rho material. This is referred to as poly-high sheet-rho material. Alternatively, the resistor may be made from a polysilicon low sheet-rho material, referred to as poly-low sheet-rho material. The sheet-rho of a material is related to its resistivity. Resistors can also be made from metal, or semiconductor diffusions, for example.

II. Process Monitor System—Overview

Figure 1:
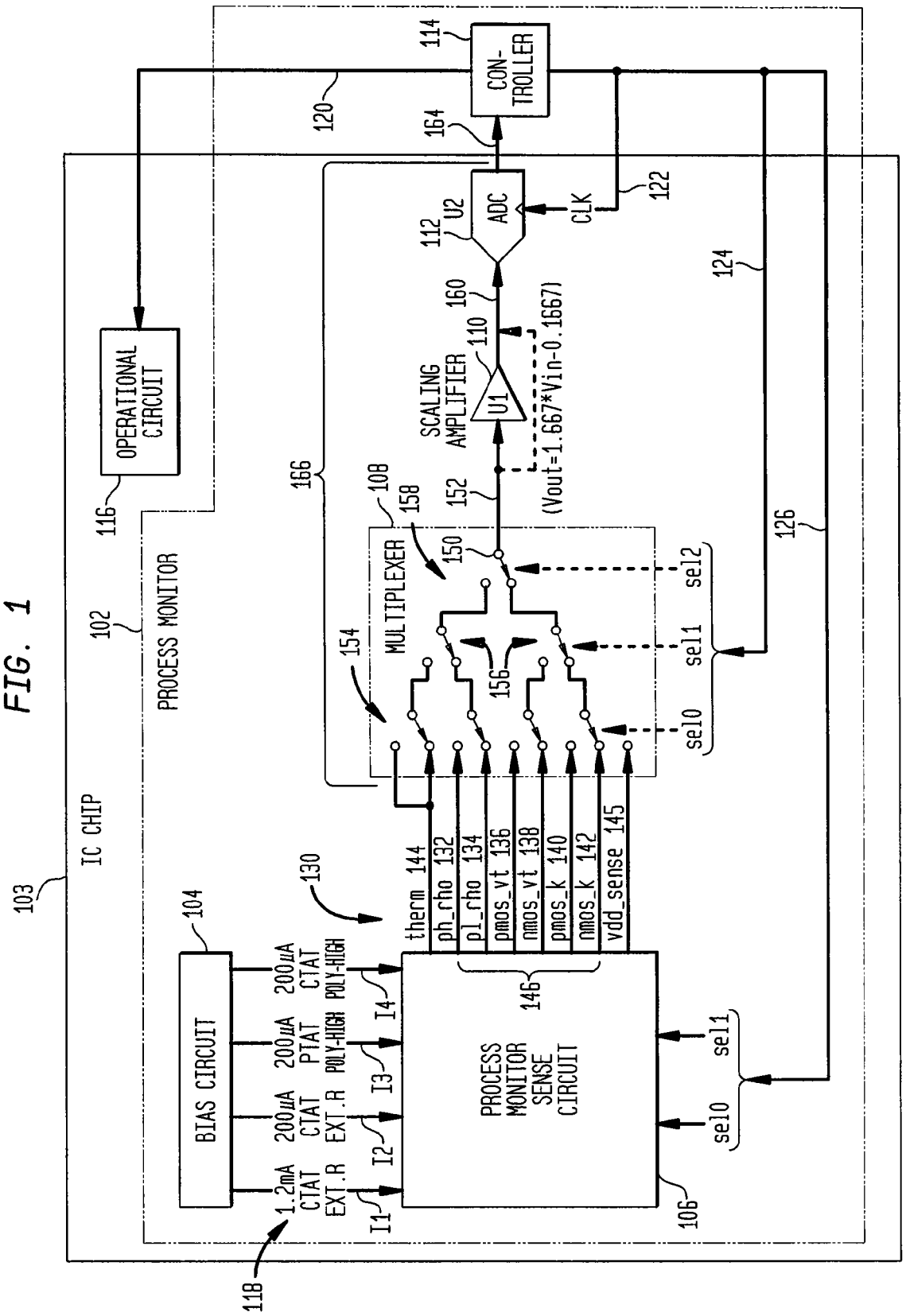
FIG. 1 is a block diagram of an example system including a process monitor, according to an embodiment of the present invention.

FIG. 1 is a block diagram of a system 100 in which embodiments of the present invention can operate. System 100 includes a process monitor system 102 (indicated in dashed-line) for monitoring process-dependent circuit parameters, environmental conditions (such as temperature) of an IC chip or substrate, and/or operational conditions (such as a power supply voltage) of the IC chip. The circuit parameters are considered "process-dependent" because they depend on the particular technology used to process the IC chip. Also, the circuit parameters may vary from IC chip to IC chip, for any given design, because of manufacturing variations in a given process across different IC chips. IC chip 103 may be a monolithic integrated circuit using a CMOS process. IC chip 103 may use other types of technologies or processes, such as Silicon Bipolar, Gallium-Arsenide (GaAs), Indium Phosphide (InP), or Silicon Germanium (SiGe) processes.

Process monitor system 102 (also referred to herein as process monitor 102) includes a bias circuit 104, a process monitor sense circuit 106, a multiplexer 108, an optional scaling amplifier 110, a digitizer or Analog-to-Digital converter 112, and a controller 114. System 100 also includes an operational circuit 116 constructed on IC chip 103.

Bias circuit 104 includes one or more current generators for generating one or more bias currents 118, including bias currents I1, I2, I3 and I4. Controller 114 provides a circuit configuration control signal 120 to operational circuit 116. Controller 114 generally also provides a clock signal 122 to digitizer 112, multiple select signals 124 to multiplexer 108, and multiple select signals 126 to sense circuit 106. In an embodiment, the bias circuit can include a bandgap voltage reference.

Sense circuit 106 is at least partially constructed on IC chip 103. Responsive to bias currents 118 and select signals 126, sense circuit 106 produces one or more sense signals 130 indicative of corresponding process-dependent circuit parameters of IC chip 103, a temperature of the IC chip, and a power supply voltage (VDD) of the IC chip. Sense signals 130 are indicative of circuit parameters of circuits in sense circuit 106, and also of other circuits of IC chip 103 that are constructed using the same process as the sense circuit, assuming relatively uniform process variations and device physical orientations across the IC chip. Sense circuit 106 produces the following sense signals:

a sense signal 132 (ph_rho) indicative of a high sheet-rho of IC chip 103;
a sense signal 134 (pl_rho) indicative of a low sheet-rho of IC chip 103;
a sense signal 136 (pmos_vt) indicative of a gate-to-source threshold voltage of a PMOS transistor constructed on IC chip 103;
a sense signal 138 (nmos_vt) indicate of a gate-to-source threshold voltage of an NMOS transistor constructed on IC chip 103;
a sense signal 140 (pmos_k) indicative of a transconductance parameter (K) of a PMOS transistor constructed on IC chip 103;
a sense signal 142 (nmos_k) indicative of a transconductance parameter (K) of an NMOS transistor constructed on IC chip 103;
a sense signal 144 (therm) indicative of a temperature of IC chip 103; and
a sense signal 145 (vdd_sense or VDD_SENSE) indicative of a power supply voltage (VDD) of the IC chip 103.

In different arrangements, sense circuit 106 may produce more or less sense signals than those listed above, and also, sense signals that are different from those listed above. In an arrangement, each of sense signals 132-145 is an analog voltage, however, in another arrangement, each of the sense signals may be an analog sense current. Alternatively, sense signals 132-145 may include both analog sense voltages and analog sense currents. Also, sense signals 132-142 (indicated generally at 146) are indicative of process-dependent circuit parameters of IC chip 103, while sense signal 144 is indicative of temperature and sense signal 145 is indicative of power supply voltage.

Sense circuit 106 provides sense signals 130 to respective inputs of multiplexer 108.

At any given time, multiplexer 108 routes a selected one of sense signals 130 to an output node 150 of multiplexer 108, in accordance with switch control signal 124. Thus, multiplexer 108 passes a selected sense signal 152 to an input of scaling amplifier 110. Multiplexer 108 includes a first column of switches 154 having switch inputs for receiving sense signals 130. Multiplexer 108 may include any number of switch inputs for receiving any number of sense signals. Switches 154 have respective switch positions controlled responsive to a control signal component sel0 common to both control signals 126 and control signals 124. The outputs of switches 154 feed the inputs of a second column of switches 156 having respective switch positions controlled responsive to a second control signal component sel1 also common to both control signals 126 and control signals 124. The outputs of switches 156 feed the inputs of an output switch 158 of multiplexer 158. Output switch 158 has a switch position controlled responsive to a control signal component sel2 of control signal 124.

Scaling amplifier 110 scales selected sense signal 152 according to a dynamic range of digitizer 112, to produce a scaled sense signal 160. Digitizer 112 digitizes scaled sense signal 160 into a digitized sense signal 164 and provides the digitized sense signal to controller 114. Typically, digitized signal 164 is represented as a digital code. Thus, digitized signal 164 is considered representative of scaled signal 160, and also of selected signal 152.

Collectively, multiplexer 108, scaling amplifier 110, and digitizer 112 represent a digitizer module 166. Digitizer module 166 produces, responsive to one or more of sense signals 130, one or more of digitized signals or codes 164 representative of the one or more of sense signals 130. Digitizer module 166 may have many alternative arrangements. For example, scaling amplifier 110 may be omitted. Also, multiplexer 108 may be omitted, and replaced with multiple digitizers (such as digitizer 112) arranged in parallel with each other, to digitize all of sense signals 130 in parallel, and so on.

Controller 114 may include digital circuits, analog circuits, firmware, software, or any combination thereof, as would be apparent to one having ordinary skill in the relevant art(s). For example, controller 114 may be a computer system including a digital controller coupled with (i) a memory for storing data and software programs, and (ii) input/output interfaces coupled to digitizer module 166 and sense circuit 106. The software programs would include one or more software modules for implementing the methods of the present invention. In different arrangements of the present invention, one or more of controller 114, multiplexer 108, scaling amplifier 110 and digitizer 112 may be on-chip or off-chip. For example, controller 114 may be on-chip.

In the arrangement depicted in FIG. 1, at any given time, controller 114 receives digitized signal 164 corresponding to only one of sense signals 130. Over time, controller 114 asserts control signals 124 and 126 such that different or successive ones of sense signals 130 are digitized and presented to controller 114. Thus, digitizer 112 presents to controller 114 digitized signals or codes representative of each of analog signal 130 over time. Based on each of these digitized representations of sense signals 130, controller 114 determines the corresponding process-based circuit parameters, temperature and/or power supply voltage of IC chip 103.

For example, controller 114 determines: a value of sheet-rho for a low sheet-rho or a high sheet-rho resistor constructed on IC chip 103; a value of a gate-to-source threshold voltage for a PMOS or an NMOS transistor constructed on the IC chip; a value of a transconductance parameter (K) of a PMOS or an NMOS transistor constructed on the IC chip; a temperature of the IC chip, and/or a power supply voltage of the IC chip. Based on one or more of these process-based circuit parameters, the temperature and/or the power supply voltage of IC chip 103, controller 114 may then determine one or more further circuit parameters associated with operational circuit 116, for example. In an embodiment, controller 114 may then assert configuration control signal 120 so as to configure operational circuit 116 responsive to the determined one or more operational circuit parameters, determined temperature and/or determined supply voltage.

Figure 1A:
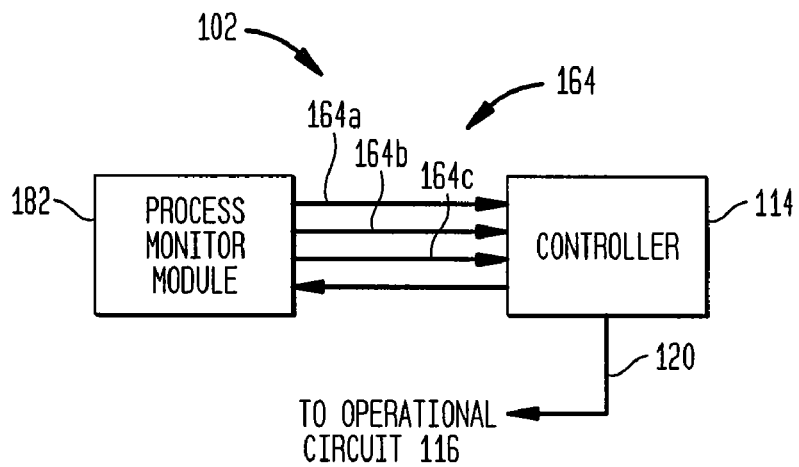
FIG. 1A is a high-level block diagram of an example process monitor system corresponding to FIG. 1.

FIG. 1A is a high-level block diagram of process monitor system 102 corresponding to that shown in FIG. 1. Process monitor system 102 includes a process monitor module 182 at least partially constructed on IC chip 103 and coupled with controller 114. Process monitor module 182 includes circuits 104, 106, 108, and 112, or alternative arrangements and portions thereof, for example, which cooperate to produce one or more digitized sense signals 164 indicative of one or more of process-dependent circuit parameters, and/or temperature, and/or power supply voltage of IC chip 103. For example, module 182 produces a digitized signal 164a indicative of a process-dependent circuit parameter of IC chip 103, a digitized signal 164b indicative of a temperature of IC chip 103, and a digitized signal 164c indicative of a power supply voltage of IC chip 103. Module 182 may provide each of digitized signals 164 to controller 114 in parallel (i.e., concurrently) or serially (i.e., sequentially). Controller 114 operates on digitized signals 164 and controls the operation of circuit 182.

III. Process Monitor Bias Circuit and Sense Circuit

Figure 2A:
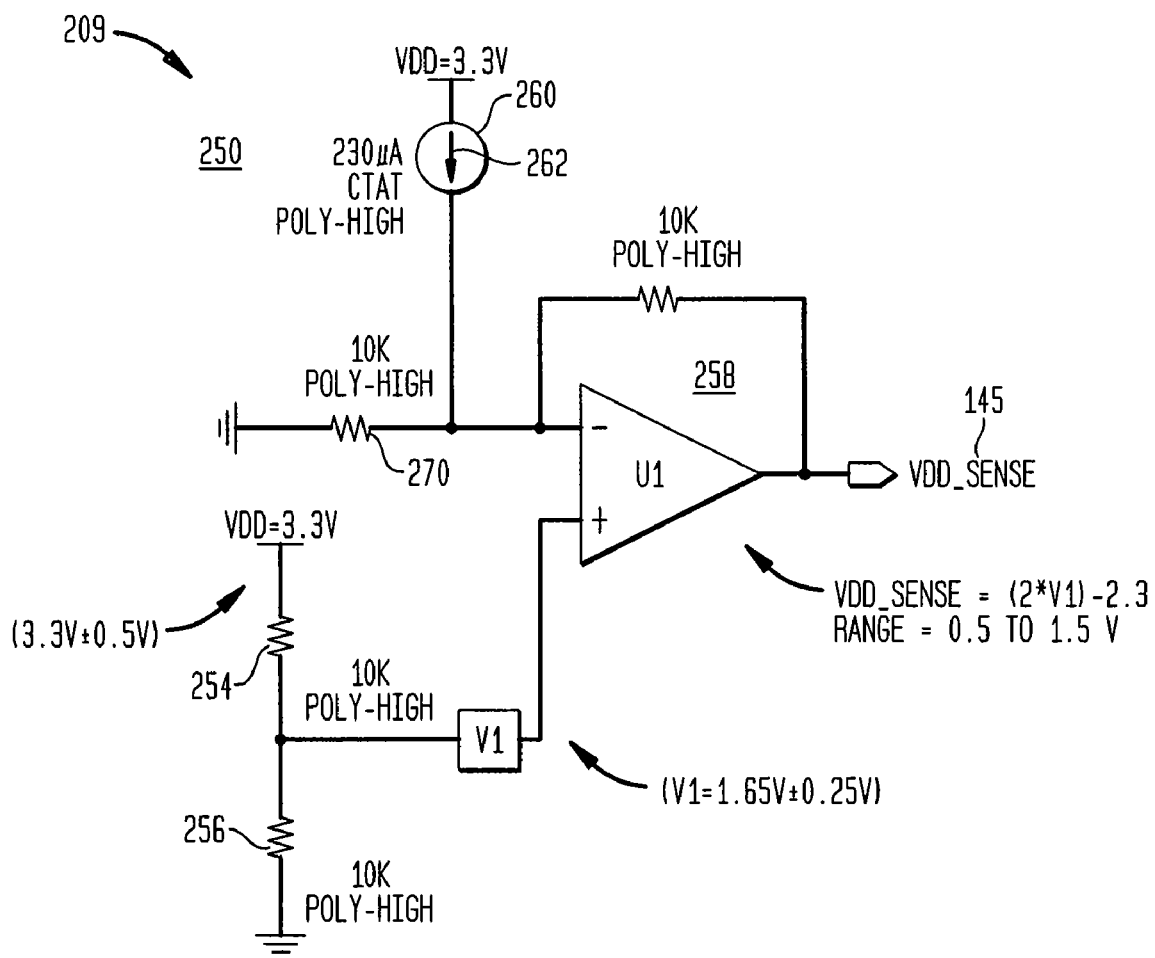
FIG. 2A is a circuit diagram of an example power supply sense element used in the process monitor sense circuit of FIG. 1.
Figure 2:
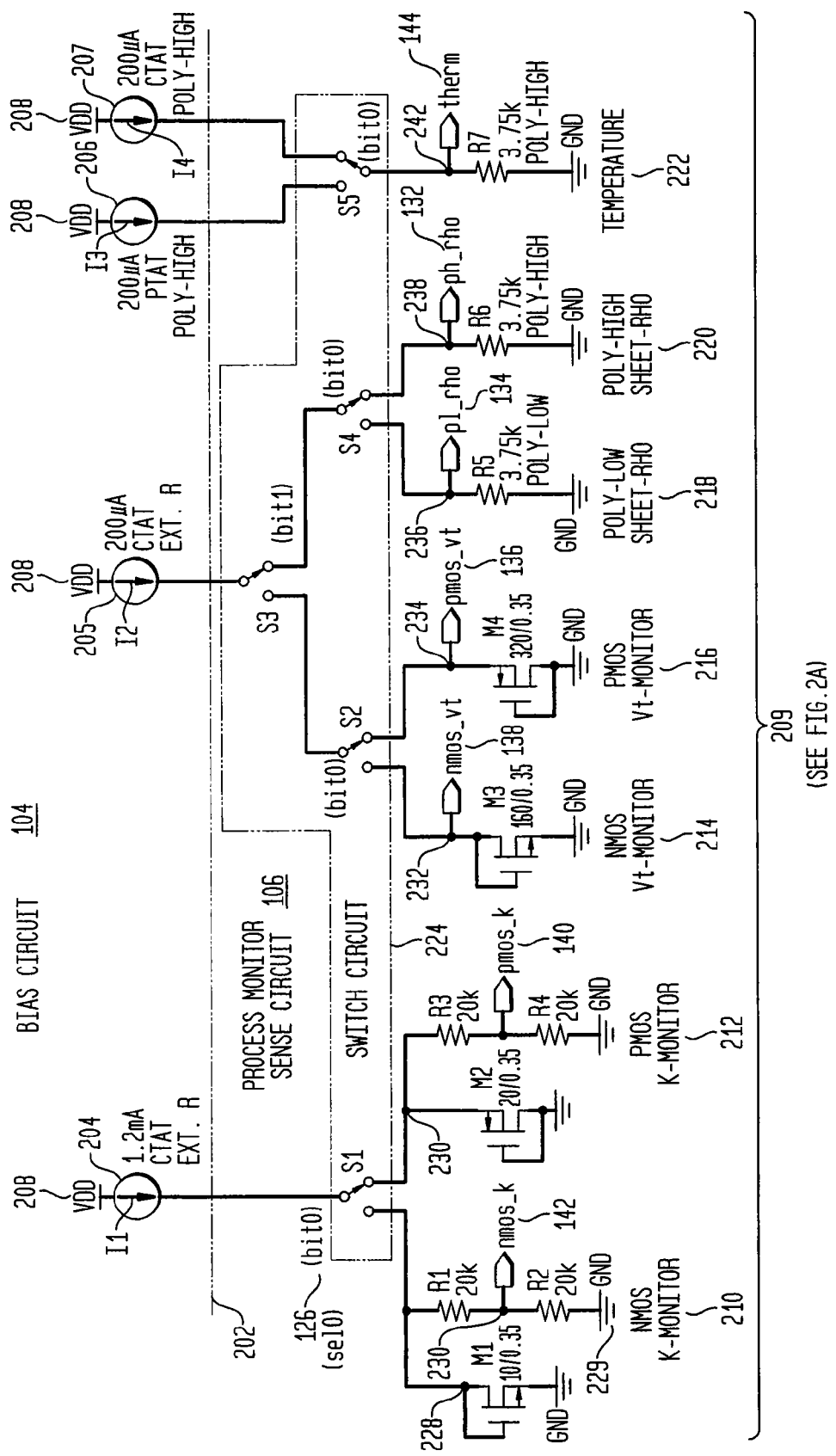
FIG. 2 is a circuit diagram of an example arrangement of a bias circuit and a process monitor sense circuit of the process monitor of FIG. 1.

FIG. 2 is a circuit diagram of an example arrangement of bias circuit 104 and process monitor sense circuit 106. Bias circuit 104 is represented above a dashed-line 202, while process monitor sense circuit 106 is represented below the dashed line 202. Example circuit parameters, including current magnitudes and types, and transistor dimensions, are indicated in FIG. 2. Bias circuit 104 is at least partially constructed on IC chip 103. Bias circuit 104 includes multiple bias current generators 204, 205, 206 and 207 for generating respective bias currents I1, I2, I3, and I4. Each of bias generators 204-207 receives power from a power supply rail 208 of IC chip 103, at a voltage VDD.

Bias current I1 is a CTAT bias current referenced to an external resistor. A CTAT bias current is a bias current that remains constant as the temperature of IC chip 103 varies. The CTAT bias current is also relatively constant as power supply voltage (VDD) varies. The CTAT bias current is also constant with respect to IC chip process variations, because the current is referenced to an off-chip resistor, as is discussed below in connection with FIGS. 3 and 4. Another reason the CTAT bias current is constant with respect to process is that the bias current is generated based on a bandgap voltage (described below) that does not vary with process. Bias current I1 has an example, relatively high current magnitude of 1.2 milli-Amperes (mA). Similarly, bias current I2 is a CTAT bias current referenced to an external resistor and has an example, relatively low current magnitude of 200 uA. The external resistor can be independent of process, temperature and VDD variations.

Bias current I3 is a PTAT bias current referenced to a poly-high sheet-rho resistor, having an example current magnitude of 200 uA. Current I3 varies in proportion to the absolute temperature (in Kelvin) of IC chip 103. However, the PTAT bias currents in the present invention are essentially independent to VDD variations. Current I3 can vary with a poly-high sheet-rho of a resistor used in generating the current.

Bias current I4 is a CTAT bias current referenced to poly-high sheet-rho resistor, having an example current magnitude of approximately 200 uA.

Sense circuit 106 includes one or more individual sense element circuits 209 constructed on IC chip 103. Each of these sense element circuits is also referred to herein equivalently and interchangeably as a sense element, a monitor, or a sensor. Multiple sense elements 209 include an NMOS k-Monitor 210, a PMOS k-Monitor 212, an NMOS Vt-Monitor 214, a PMOS Vt-Monitor 216, a poly-low sheet-rho sense element 218, a poly-high sheet-rho sense element 220, a temperature sensor 222, and a power supply voltage (VDD) sensor 250 (depicted in FIG. 2A).

Sense circuit 106 also includes a switch circuit 224, including multiple bias current switches S1, S2, S3, S4 and S5, coupled between bias circuit 104 and sense elements 209. Switches S1-S5 may be transmission-gate switches. Switches S1-S5 selectively direct bias currents I1, I2, I3 and I4 to selected ones, or a subset, of sense elements 209, responsive to switch control component signals sel0 (also referred to as bit0) and sel1 (also referred to as bit1). More specifically, switch S1 directs bias current I1 to either sense element 210 or sense element 212 in accordance with component signal sel0. Collectively, switches S3, and S2 and S4, direct bias current I2 to one of sense elements 214, 216, 218 and 220, in accordance with component switch control signals sel0 and sel1. Also, switch S5 directs either bias current I3 or bias current I4 to sense element 222 in accordance with component signal sel0.

Although sensor 250 is depicted in FIG. 2A as having a dedicated current source (260), in an alternative arrangement, any of current sources 205 and 207 may be switched to supply a CTAT bias current to sense element 250.

A. Transconductance Parameter (K) Monitors

Sense element 210 includes a relatively small NMOS transistor M1 connected or configured as a diode. That is, transistor M1 includes a gate and a drain connected together at a node 228, and a source connected to a ground terminal 229 of IC chip 103, that is at a ground potential (GND). Transistor M1 is a composite transistor. A composite transistor includes a plurality of unit transistors connected in parallel with each other. Such composite transistors are known. Assume the composite transistor is constructed using m unit transistors. Then, the composite transistor is an m gate device. The gate has a unit width, such as 5 microns (5 um), for example. The composite or effective width W (sometimes referred to as We in the literature) is equal to m times the unit width. Also, the composite transistor has a length L, such as 0.35 microns (0.35 um), depending the CMOS process. The transistors depicted in FIG. 2 are composite transistors. In FIG. 2, the descriptor "10/0.35," near the reference identifier M1, indicates transistor M1 has exemplary characteristics "We/L," where We=10 um and L=0.35 um.

Sense element 210 optionally includes a potential voltage divider including a resistor R1 and a resistor R2 connected in series with one another and between node 228 and ground. Sense signal 142 is tapped-off from a node 230 between resistors R1 and R2. The voltage divider establishes sense signal 142 at a voltage commensurate with a dynamic range of digitizer 112. The use of large resistance value resistors in the voltage divider limits current through the resistors, which reduces error in the sense voltage. In another arrangement, sense signal 142 may be taken directly from node 228. In another arrangement, a buffer amplifier having an exemplary gain of 0.5 can be used instead of a resistor voltage divider.

When switch S1 is positioned so as to direct or supply bias current I1 to sense element 210, transistor M1 develops a gate-to-source voltage at node 228. Transistor M1 is sized in relation to the magnitude (ID) of current I1 so that transistor M1 operates at a relatively high current density (HCD) JHCD. Thus, transistor M1 is referred to as a high current density device. Due to the high current density in transistor M1, the gate-to-source voltage established at node 228 is substantially greater than the gate-to-source threshold voltage of the transistor. For example, in a 0.35 micron CMOS process, the gate-to-source voltage at node 228 may be in the approximate voltage range of 1.5 to 2.0 volts, whereas the threshold voltage may be only approximately 500 millivolts. The difference between the voltage at node 228 and the gate-to-source threshold voltage of transistor M1 is indicative of the transconductance parameter (K) of the transistor. In this way, the voltage at node 228 is indicative of the transconductance parameter. Stated otherwise, transistor M1 is biased at a large value of gate-to-source voltage (VGS) minus threshold voltage (VTH), which provides useful information on the transconductance parameter K. Because the voltage at node 228 is proportional to the voltage of sense signal 142 (nmos_k), sense signal 142 is similarly indicative of the transconductance parameter.

Sense element 212 is similar in construction and operation to sense element 210 except that sense element 212 includes a relatively small PMOS transistor M2 connected as a diode, instead of the NMOS transistor used in circuit 210. Sense element 212 also includes an optional potential divider, including resistors R3 and R4 connected in series with each other and between node 230 and ground. Similar to above, the voltage divider establishes sense signal 140 at a tap-point between the resistors, such that the voltage is commensurate with a dynamic range of digitizer 112.

When switch S1 directs relatively large bias current I1 to sense element 212 as depicted in FIG. 2, transistor M2 develops a gate-to-source voltage at a node 230 (which is connected to the source of transistor M2). Transistor M2 is sized in relation to the magnitude of current I1 so that transistor M2 operates at a relatively high current density JHCD. Thus, the voltage at node 230 is substantially greater than the gate-to-source threshold voltage of transistor M2. The voltage at node 230, and correspondingly, the voltage of sense signal 140 (pmos_k), is indicative of the transconductance parameter of transistor M2.

B. Threshold Voltage $V_{TH}$ Monitors

Sense element 214 includes a relatively large NMOS transistor M3 connected as a diode between ground and an output node 232 (which is connected to the gate and drain of transistor M3). When switches S3 and S2 are configured to direct or supply relatively small bias current I2 to sense element 214, transistor M3 develops a gate-to-source voltage at node 232 (i.e., sense signal 138 (nmos_vt)) responsive to current I2. Transistor M3 is sized in relation to the magnitude of current I2 such that transistor M3 operates at a low current density (LCD) JLCD, e.g., in relation to the high current density at which transistors M1 and M2 operate. This low current density causes the gate-to-source voltage developed at node 232 to be at or near the gate-to-source threshold voltage of transistor M3. For example, in a 0.35 micron CMOS process, the threshold voltage may be approximately 500 millivolts. Thus, sense signal 138 is representative of the gate-to-source threshold voltage of transistor M3.

Sense element 216 includes a relatively large PMOS transistor M4 connected as a diode between ground and an output node 234 (which is connected to source of transistor M4). When switches S3 and S2 are configured to direct or supply relatively small bias current I2 to sense element 216, transistor M4 develops a gate-to-source voltage at node 234 representing sense signal 136 (pmos_vt). Transistor M4 is sized in relation to the magnitude of current I2 such that transistor M4 operates at a low current density, e.g., in relation to the high current density at which transistors M1 and M2 operate. This low current density causes transistor M4 to develop a voltage at node 232 that is at or near the gate-to-source threshold voltage of the transistor. Thus, sense signal 136 is representative of the gate-to-source threshold voltage of transistor M4.

C. Sheet-Rho Monitors

If a known, constant bias current is applied to an known resistance value of an on-chip resistor, the voltage developed across the resistor will be proportional to its resistance value. A voltage higher than nominal would indicate high sheet resistance (sheet-rho) for this type of resistor, and vice-versa. Sense element 218 and 220 take advantage of this effect.

Sense element 218 includes a resistor R5 connected between an output node 236 and ground. Resistor R5 is made of a resistance material, such as polysilicon, having a relatively low sheet-rho. When switches S3 and S2 are configured to supply bias current I2 to resistor R5, the resistor develops a voltage at node 236 corresponding to sense signal 134 (pl_rho).

Sense element 220 includes a resistor R6 coupled between ground and output node 238. Resistor R6 is made of a resistance material such as polysilicon and has a relatively high sheet-rho, compared to the sheet resistance of resistor R5. When switches S3 and S4 direct bias current I2 to resistor R6, the resistor develops a voltage at output node 238 corresponding to sense signal 132 (ph_rho).

D. Temperature Sensor

Sense element 222 includes a resistor R7 connected between an output node 242 and ground. When switch S5 is configured to direct CTAT bias current I4 to resistor R7, resistor R7 develops a first voltage at node 242. On the other hand, when switch S5 is configured to direct PTAT bias current I3 to resistor R7, the resistor develops a second voltage at node 242. A difference between the first voltage and the second voltage developed at node 242 indicative of a temperature of IC chip 103.

E. Power Supply Voltage (VDD) Sensor

FIG. 2A is a circuit diagram of sense circuit 250 for monitoring power supply voltage VDD of IC chip 103. Sense circuit 250 is coupled to a power supply rail of IC chip 103. A voltage divider, including resistors 254 and 256, presents a voltage V1 equal to one-half VDD to a positive input of an operational amplifier (opamp) 258. For example, if VDD=3.3 Volts (V) and can vary +/−0.5V, then the positive input to opamp 258 will be 1.65V+/−0.25V. Note that is not important what type of resistors are used, so long as both resistors 254 and 256 match each other.

Figure 3:
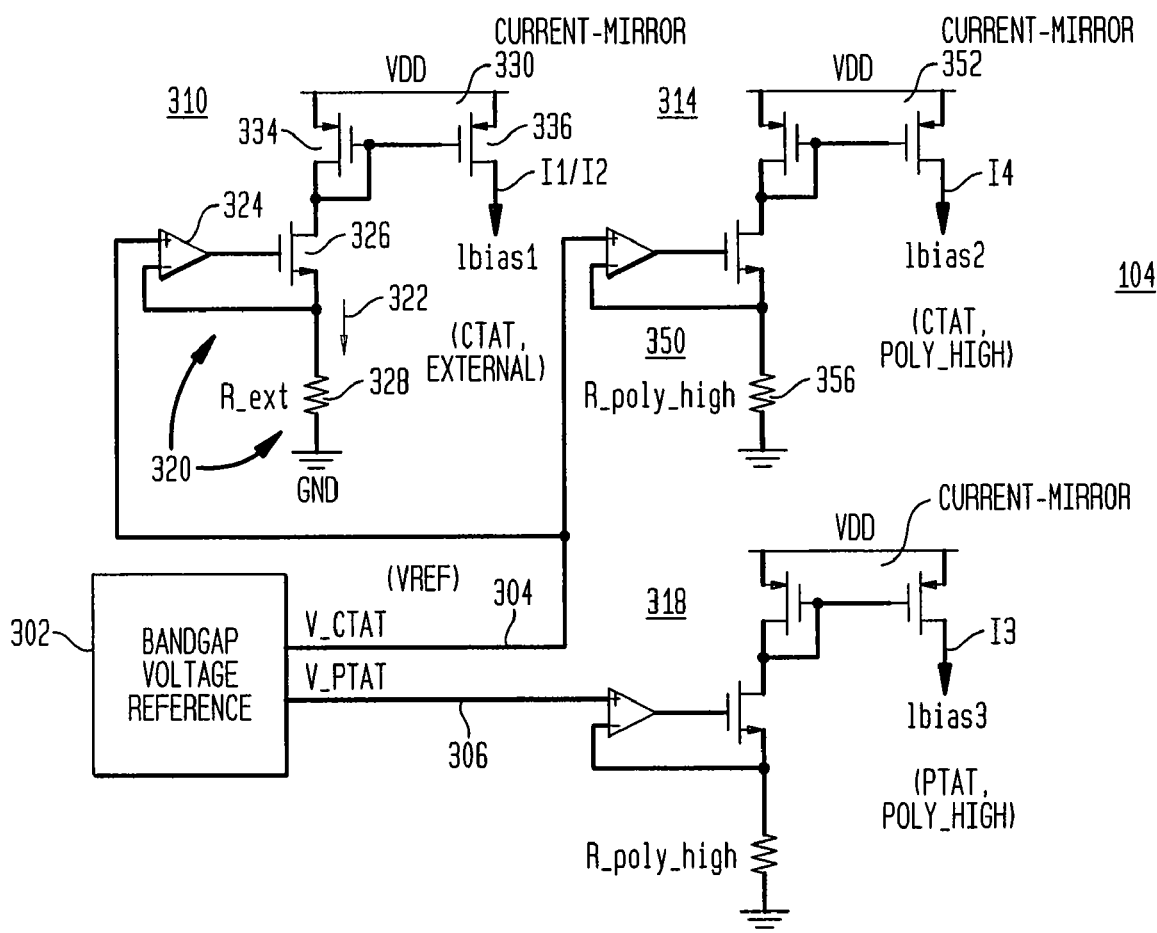
FIG. 3 is a circuit diagram expanding on the bias circuit of FIG. 2.

A current source 260 supplies a CTAT current 262 referenced to an internal (i.e., on-chip) poly-high resistor (see FIG. 3 for details). When current 262 drives a resistor 270, a Thevenin equivalent circuit is formed that is the same as a 2.3V fixed Direct Current (DC) voltage source in series with a 10 kilo-ohm poly-high resistor. Since poly-high resistors are used in both the bandgap-based current reference (FIG. 3) and VDD sense element 250, variations in resistor sheet-rho are cancelled out. Resistor 270 sets the proper gain for VDD sense circuit 250. The end result is a circuit with the following transfer function:

$$VDD\_SENSE = (2*V1) - 2.3$$

where VDD_SENSE (signal 145) is indicative of power supply voltage VDD.

The transfer function above creates VDD_SENSE such that it ranges from 0.5V to 1.5V as VDD changes from 3.3−0.5V to 3.3+0.5V, substantially perfectly matching the input range of digitizer 112. Thus, VDD sense circuit 250 presents an input to digitizer 112 with full resolution as VDD changes over a +/−0.5V range, from its nominal value of 3.3V. Other VDD sense circuits can be designed based on similar approaches.

F. Nominal Voltage Monitor

Figure 2B:
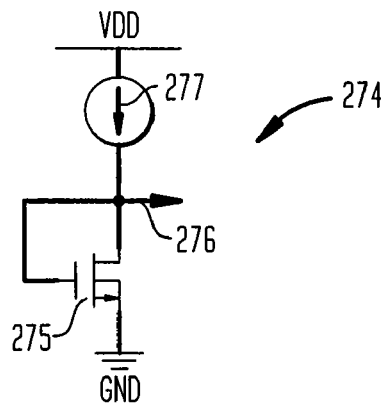
FIG. 2B is a circuit diagram of an example "nominal voltage" monitor used in the process monitor sense circuit of FIG. 1.

In an embodiment, process monitor sense circuit 106 includes another type of monitor or sense circuit referred to herein as a "nominal voltage" monitor, depicted in FIG. 2B. FIG. 2B is a circuit diagram of an example "nominal voltage" monitor 274. Monitor 274 has a circuit structure that is similar to or the same as that of the K monitor (e.g., monitor 210 or 212) or the VTH monitor (e.g., monitor 214 or 216). For example, "nominal voltage" monitor 274 includes a transistor 275 configured to produce a sense signal (i.e., its gate-source voltage) 276 responsive to a bias current 277 supplied to the transistor. As will be described below, sense signal 276 is representative of a nominal gate-to-source voltage, which is a process-dependant circuit parameter. "Nominal voltage" monitor 274 provides sense signal 276 (i.e., its gate-to-source voltage) to multiplexer 108, for example, in signal set 130.

Transistor 275 is configured similar to or in the same way as any of transistors M1, M2 M3, or M4 in FIG. 2 are configured in their respective monitor circuits. However, in contrast to the K and VTH monitors, transistor 275 is sized in relation to bias current 277 so as to operate at (i) a nominal current density that is between the relatively high and low current densities of the K and VTH monitors, and (ii) a corresponding nominal gate-to-source voltage that is between the relatively high and low gate-to-source voltages associated with the K and VTH monitors. The nominal current density and corresponding nominal gate-to-source voltage are representative of a nominal (i.e., typical) current density and a corresponding nominal gate-to-source voltage, respectively, associated with transistors in operational circuit 116. For a 0.35 micron CMOS process, an example nominal gate-to-source voltage is approximately 1.2 volts.

The example process-dependent circuit parameters described above, including (i) the nominal gate-to-source voltage, (ii) the transconductance parameter (K), and (iii) the gate-to-source threshold voltage VTH, are together generally referred to as "transistor-dependent" process-dependent circuit parameters because they relate to (i.e., are associated with) and/or characterize transistors constructed on the IC chip. The present invention is not limited to these transistor-dependent circuit parameters.

IV. Process Monitor Bias Circuit

FIG. 3 is a circuit diagram of an example arrangement of bias circuit 104. Bias circuit 104 includes a bandgap voltage reference circuit 302 that generates a CTAT voltage 304 (V_CTAT), and a PTAT voltage 306 (V_PTAT). Circuit 302 provides CTAT voltage 304 to a first current generator 310 for generating CTAT bias current I1 (or for generating CTAT bias current I2) and a current generator 314 for generating CTAT bias current I4. Bandgap circuit 302 provides PTAT voltage 306 to a current generator 318 for generating PTAT bias current I3.

Current generator 310 includes a circuit 320 for converting CTAT voltage 304 to a corresponding CTAT current 322. Circuit 320 includes an operational amplifier 324 that receives CTAT voltage 304, and in response, drives the gate of a transistor 326. Transistor 326 has a source-drain current path connected in series with an off-chip resistor 328 (R_ext). Resistor 328 is selected to have a very low temperature coefficient. Resistance 328 is also selected to have a tight tolerance of between 1% and 5% in its absolute resistance value, typically. Current generator 310 also includes a current mirror 330 coupled between circuit 320 and a power supply rail at the voltage VDD. Current mirror 330 includes a diode connected transistor 334 connected between the source-drain path of transistor 326 and the power supply rail. Current mirror 330 also includes a mirror transistor 336 coupled to transistor 334. Current mirror 330 mirrors current 322 in output transistor 336, as either bias current I1 (or bias current I2). Transistors 334 and 336 may be sized in relation to each other to scale the magnitude of current I1 (or I2) in relation to the magnitude of current 322.

Current generator 314 includes a circuit 350 (similar to circuit 320), coupled with a current mirror 352 (similar to current mirror 330). Circuit 350 include a resistor 356 made of a resistance material having a relatively high sheet-rho. Preferably, resistor 356 is constructed on-chip so as to match other on-chip resistors.

Current generator 318 is configured in the same manner as current generator 314. However, current generator 318 generates bias current I3 from PTAT voltage 306. Thus, bias current I3 is a PTAT bias current instead of a CTAT bias current. Alternative circuits may be used for generating the PTAT and CTAT currents used in the present invention, as would be apparent to one having ordinary skill in the relevant art(s) given the present description.

Figure 4:
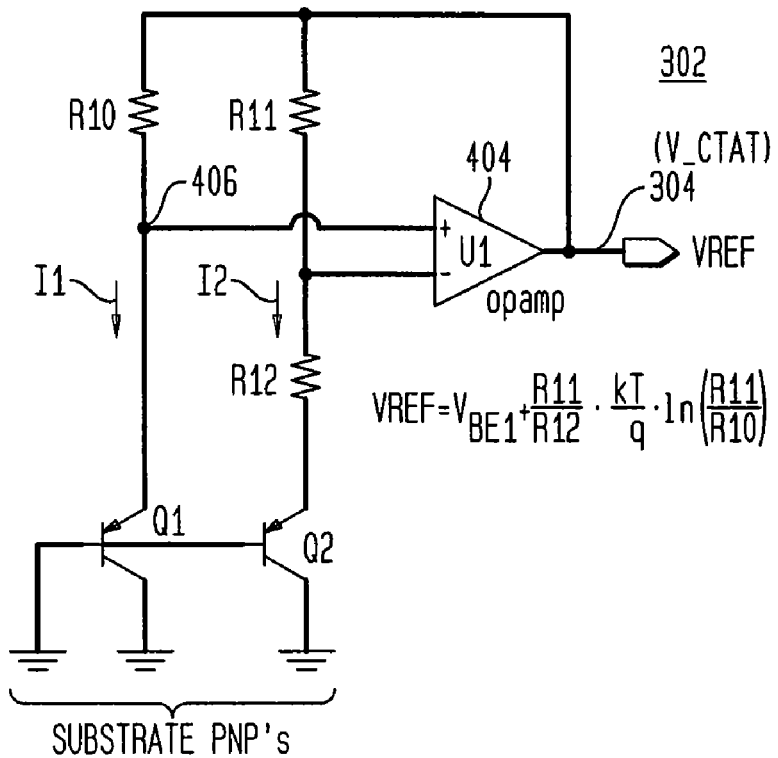
FIG. 4 is a circuit diagram of an arrangement of a bandgap voltage reference circuit.

FIG. 4 is a circuit diagram of an arrangement of a bandgap voltage reference circuit 302. Circuit 302 includes a pair diode-connected of bipolar transistors Q1 and Q2 connected with a network of resistors R10, R11 and R12. Tap points off of the resistor network feed an operational amplifier 404 that generates CTAT voltage 304 (also referred to as VREF in FIG. 4). Circuit 302 produces PTAT voltage 306, or a voltage from which the PTAT voltage may be derived, at a node 406 of the resistor network, possibly with the aid of a scaling amplifier.

V. Reduced Complexity Process Monitor System

Figure 5:
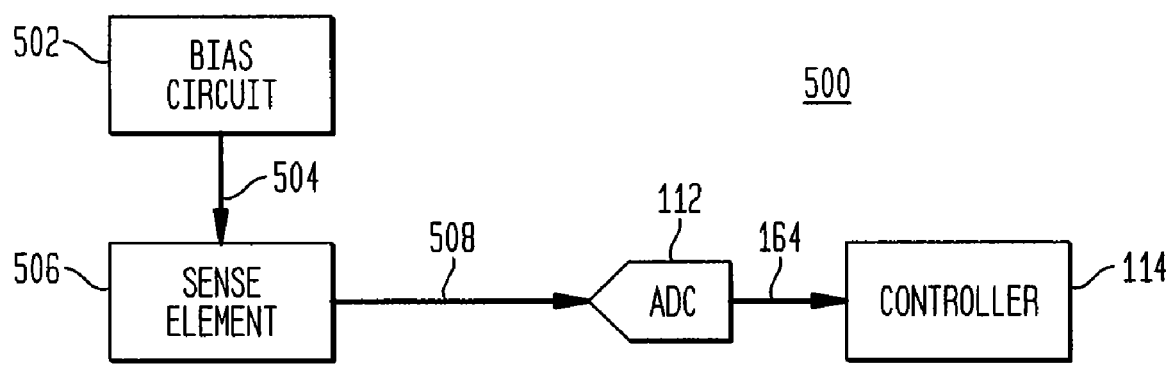
FIG. 5 is a block diagram of a simplified arrangement of a process monitor, according to an embodiment of the present invention.

FIG. 5 is a block diagram of a simplified arrangement of a process monitor, according to an embodiment of the present invention. Process monitor system 500 includes a bias circuit 502 that generates a bias current 504. Bias circuit 502 includes one or more of current generators I1-I5. A sense element 506 produces a sense signal or voltage 508 responsive to bias current 504. Sense element 506 may be any one of sense circuits 210-222, 250 and 270, for example. Digitizer 112 digitizes sense signal 508 into digitized code 164. In the simplified process monitor, digitizer module 166 reduces to digitizer 112. Digitizer 112 may be implemented in any number of ways. For example, digitizer 112 may include a digital-to-analog converter (DAC) and a latching comparator each coupled to controller 114. The comparator compares a received sense voltage against an analog voltage from the DAC, which is established by controller 114. The controller "searches" through a set of analog voltages from the DAC using a successive approximation register (SAR) routine, to determine a digital value of the received sense voltage. Such an implementation would be apparent to one having ordinary skill in the relevant art(s).

Controller 114 converts digitized code 164 into a corresponding value of the parameter sensed by sense element 506.

VI. Processing Sense Voltages and Controller Methods

In the ensuing mathematical analysis and description of processing methods, each of the sense signals 130, and selected sense signal 152, are represented generally as a voltage Vsense, unless otherwise indicated. Also, scaled signal 160 is represented generally as a voltage VSA, unless otherwise indicated. Also, digitized signal 164 is represented generally as "code." Also, portions of the mathematical analysis below relate to excerpts from the following texts:

Phillip E. Allen & Douglas R. Holbert, CMOS Analog Circuit Design, pp. 58-66 and 76-86, Saunders College Publishing 1987, ISBN 0-03-006587-9; and David A. Johns & Ken Martin, Analog Integrated Circuit Design, pp. 16-39 and 57-60, John Wiley & Sons, Inc. 1997, ISBN 0-471-14448-7, each of the excerpts being incorporated herein in its entirety by reference.

A. Converting Sense Voltage to Digitizer Code

Digitizer 112 converts scaled sense signal 160 to digital code 164. In an example arrangement, digitizer 112 produces a 6-bit code having a range corresponding to a range of scaled sense signal 160. Digitizer 112 digitizes voltages between 0.5 and 1.5 volts, with 6-bit resolution. Voltages below 0.5 volts result in a code of 0 and voltages above 1.5 volts result in a code of 63. A resolution of 6-bits is given only as an example, and any other resolution may be used. Digitizer 112 produces a code from an input voltage according to the following code-to-scaled-sense-voltage relationship:

$$\text{code} = \text{int}\left[\frac{V_{SA} - 0.5}{1.0} \cdot (63)\right] \quad \text{eq. (1)}$$

where: VSA represents a scaled sense voltage (i.e., the magnitude of scaled signal 160); and "code" represents the code value produced by digitizer 112, responsive to scaled sense voltage VSA.

For example, let VSA=1050 mV, then:

code=int[34.65]=34

B. Converting Digitizer Code to Scaled Sense Voltage

Controller 114 can determine a voltage level (or "voltage") of scaled sense signal 160 based on the value of digitized code 164. For example, controller 114 can convert a digitizer code to a corresponding scaled sense voltage, according to the following scaled-sense-voltage-to-code relationship:

$$V_{SA} = \frac{\text{code} \cdot (1.0)}{63} + 0.5 \quad \text{eq. (2)}$$

For example, let code=23, then:

$$V_{SA} = \frac{27 \cdot (1.0)}{63} + 0.5 = 0.9286$$

C. Converting Scaled Voltage to Sense Voltage

Controller 114 can use the following relationships to convert a scaled sense voltage (i.e., the magnitude of scaled sense signal 160) into a sense voltage (i.e., the magnitude of selected signal 152 representative of one of sense signals 130):

$$V_{SA} = 1.667 \cdot V_{sense} - 0.1667$$

where Vsense represents the voltage level of selected sense signal 152 (and thus, of the selected one of sense signals 130).

To get the sense voltage Vsense:

$$V_{sense} = \frac{V_{SA} + 0.1667}{1.667} \quad \text{eq. (3)}$$

For example, let VSA=1.000, then:

$$V_{sense} = \frac{1.000 + 0.1667}{1.667} = 0.6999$$

The above relationships for converting scaled voltage $V_{SA}$ (signal 160) to sense voltage $V_{sense}$ (signal 152) take into account a transfer function of scaling amplifier 110.

D. Determining Temperature (T)

Controller 114 may determine the temperature of IC chip 103 based on sense signal 144, as represented in digitized code 164. The temperature may be determined as follows. First, apriori temperature-sense voltage data is established. For example, simulations and/or actual test data may be used to find sense voltages of sense signal 144 (therm) at different IC chip temperatures. Based on this established apriori data, during the operation of process monitor 100, digitized code 164 can be used to determine IC chip temperature.

For example, consider the following apriori data:
When T=0 C, $V_{sense}$=0.6370 volts
When T=100 C, $V_{sense}$=0.8843 volts where $V_{sense}$ represents the voltage of sense signal 144.

Fitting these data points to a straight line:

$$V_{sense} = (2.473 \cdot 10^{-3}) \cdot T + 0.6370$$

Combining the previous equations (1), (2) and (3), and solving for T:

$$T = (3.851) \cdot \text{code} - 95.84 \quad \text{eq. (4)}$$

For example, let code=33, then:

$$T = (3.851) \cdot (33) - 95.84 = 31.2$$

In another embodiment, temperature T may be determined based on determined values of sheet-rho and a bias current resistor size, and a temperature coefficient of the resistor.

E. Determining Transistor Threshold Voltage $V_{TH}$

Process monitor 102 can be used to determine a gate-to-source threshold voltage of a transistor constructed on IC chip 103. Specifically, process monitor 102 can determine the gate-to-source threshold voltage of either of transistors M3 and M4 in respective sense elements 214 and 216. The determined gate-to-source threshold voltage is representative of the gate-to-source threshold voltages of other transistors constructed on IC chip 103, for example, in operational circuit 116, because all such circuits use the same process.

The current $I_D$ flowing in low current density (LCD) transistor M3 or M4, for example, is given by the following expression:

$$I_D = \frac{K}{2} \cdot \frac{W}{L} \cdot (V_{GS\_LCD} - V_{TH})^2 \cdot [1 - \lambda(V_{DS} - V_{\textit{eff}})] \quad \text{eq. (5)}$$

where:

$I_D$ is the Direct Current (DC) drain current of the low current density (LCD) transistor M3 or M4;

K is the transconductance parameter of the transistor, sometimes given as $\mu_n C_{ox}$ (where $\mu_n$ is a mobility of electrons near a surface of the IC chip material, in units of meters$^2$/Volt-Second; and $C_{ox}$ is a gate capacitance/unit area, in units pico-farad/meter$^2$);

W is the width of the transistor;

L is the channel length of the transistor;

$V_{GS\_LCD}$ is the gate-source voltage of the transistor. Here, $V_{GS\_LCD}$ corresponds to sense signal 138 (nmos_vt) or 136 (pmos_vt);

$V_{TH}$ is the threshold voltage of the transistor;

$\lambda$ is the channel length modulation parameter (usually small);

$V_{DS}$ is the drain-source voltage of the transistor; and $V_{\textit{eff}}$ is the voltage at which the transistor is in-between saturation and triode operation.

Neglecting channel length modulation effects for mathematical convenience:

$$I_D = \frac{K}{2} \cdot \frac{W}{L} \cdot (V_{GS\_LCD} - V_{TH})^2$$

Solving for $V_{TH}$:

$$V_{TH} = V_{GS\_LCD} - \sqrt{\left(\frac{2I_D}{K}\right) \cdot \left(\frac{L}{W}\right)} \approx V_{GS\_LCD} \quad \text{eq. (6)}$$

(for very low drain currents)

Thus, if $I_D$ is very low for the particular size device, then $V_{TH} = V_{GS}$ (where $V_{GS}$ is $V_{GS\_LCD}$). It is to be understood that channel length modulation effects need not be neglected in the analysis above and below.

F. Determining Transistor Transconductance Parameter K

Process monitor 102 can be used to determine a transconductance parameter K of a transistor constructed on IC chip 103. Specifically, process monitor 102 can determine the transconductance parameter K of either of transistors M1 and M2 in respective sense elements 210 and 212. The determined transconductance parameter is representative of the transconductance parameter of other transistors constructed on IC chip 103, such as transistors M3 or M4, or transistors in operational circuit 116.

The current $I_D$ flowing through high current density transistor M1 or M2, for example, is given by:

$$I_D = \frac{K}{2} \cdot \frac{W}{L} \cdot (V_{GS\_HCD} - V_{TH})^2 \cdot [1 - \lambda \cdot (V_{DS} - V_{\textit{eff}})] \quad \text{eq. (7)}$$

where:

$I_D$, K, W, L, $V_{TH}$, $V_{DS}$, and $V_{\textit{eff}}$ are as before, but correspond to transistors M3 and M4;

$V_{GS\_HCD}$ is the gate-source voltage of the high current density transistor M1 or M2 in sense element 210 or 212. Here, $V_{GS\_HCD}$ corresponds to sense signal 142 (nmos_vt) or 140 (pmos_k), as adjusted by the resistive voltage divider (R1,R2, or R3,R4).

Neglecting channel length modulation effects for mathematical convenience:

$$I_D = \frac{K}{2} \cdot \frac{W}{L} \cdot (V_{GS\_HCD} - V_{TH})^2$$

Solving for K:

$$K = (2I_D) \cdot \left(\frac{L}{W}\right) \cdot \frac{1}{(V_{GS\_HCD} - V_{TH})^2} \quad \text{eq. (8)}$$

In the above expression for K, $I_D$ is predetermined, that is it is known from accurate design of current mirrors in the bias circuit that supply bias currents to the sense elements. W and L are predetermined, that is, known from the design layout. $V_{TH}$ can be determined as described above based on sense signals 138 (nmos_vt) or 136 (pmos_vt). $V_{GS\_HCD}$ is the sense voltage from transistor M1 or M2, in sense element 214 or 216. Thus, K can be determined.

Thus, process monitor 102 determines the transconductance parameter K in a two step process. First, process monitor 102 determines the gate-to-source threshold voltage $V_{TH}$ of a transistor constructed on IC chip 103, based on sense signal 138 or 136. Next, process monitor 102 determines the transconductance parameter K of a transistor constructed on IC chip 103 based on the determined threshold voltage $V_{TH}$ and sense signal 142 or 140.

G. Example of Determining $V_{TH}$ and K

Let $code_{LCD}$=10, where $code_{LCD}$ represents the digitized code corresponding to sense signal 138 or 136;

Let $code_{HCD}$=34, where $code_{HCD}$ represents the digitized code corresponding to sense signal 142 or 140.

Assume that the high current density transistor M1 or M2 operates at 1.2 mA.

First, we find VTH. Assuming that the low current density device M3 or M4 operates at VTH (due its very low current density), we find:

$$V_{sense\_LCD} = V_{GS\_LCD} \approx V_{TH} = \frac{code_{LCD}}{105} + 0.4 = \frac{10}{105} + 0.4 = 0.495$$

where Vsense_LCD is the sense voltage produced by device M3 or M4.

Next, we find K. We convert the $code_{HCD}$ for the high current density device M1 or M2 to its corresponding sense voltage:

$$V_{sense\_HCD} = V_{GS\_HCD} = \frac{code_{HCD}}{105} + 0.4 = \frac{34}{105} + 0.4 = 0.724$$

From the two sense voltages $V_{sense\_HCD}$ and $V_{sense\_LCD}$ (where $V_{sense\_LCD}$ corresponds to $V_{TH}$), we can find the transconductance parameter, K:

$$K = (2I_D) \cdot \left(\frac{L}{W}\right) \cdot \frac{1}{(V_{GS\_HCD} - V_{TH})^2}$$

$$= (2) \cdot (1.2 \text{ mA}) \cdot \left(\frac{0.35 \text{ um}}{2 \cdot 5 \text{ um}}\right) \frac{1}{(0.724 - 0.495)^2}$$

$$= 1.602 \cdot 10^{-3} A/V^2$$

H. Example of Determining Sheet-rho

Assume that

When R'=0.8, $V_{sense}$=0.6035 volts, and

When R'=1.2, $V_{sense}$=0.9420 volts where: R' is $R_{actual}/R_{ideal}$, or a corresponding ratio of sheet-rhos;

$V_{sense}$ represents the voltage of sense signal 134 or 132.

Fitting these data points to a straight line:

$$V_{sense} = (0.8463) \cdot R' - 0.0735$$

Combining the previous equations (1) and (3) and solving for R':

$$R = \frac{code}{88.57} + (0.5614) \qquad \text{eq. (9)}$$

where: "code" represents the digitized code (signal 164) corresponding to sense signal 134 or 132.

For example, let code=48, then:

$$R' = \frac{48}{88.57} + (0.5614) = 1.103$$

Thus with a code of 51, the poly-high sheet-rho is 10.3% high.

If the nominal value of R was 50 ohms, then:

$$R_{actual} = (50) \cdot (1.103) = 55.17 \text{ ohms}$$

I. Determining Small-Signal Transconductance $g_m$

Process monitor 102 can be used to determine the small-signal transconductance $g_m$ of a transistor constructed on IC chip 103 (e.g., in one of sense elements 210-216, or in operational circuit 116). The transconductance $g_m$ of the transistor is given by the following general expression:

$$g_m = \sqrt{2K\left(\frac{W}{L}\right) \cdot |I_D|} \qquad \text{eq. (10)}$$

where:

$g_m$ is the small-signal transconductance of the transistor;

K is the transconductance parameter;

W is the width of the transistor;

L is the channel length of the transistor; and $I_D$ is the drain current.

Assume W, L and $I_d$ have predetermined or known values. Then, $g_m$ can be determined once K is determined. In an example, assume a composite transistor is constructed on IC chip. The composite transistor is constructed using m=32 unit transistors. Then, the composite transistor is a thirty-two (32) gate device, where each gate has a unit width of 5 um. Also, assume the composite transistor is a 0.35 micron device, that is, that the length L=0.35 um. Also, assume that the composite transistor operates at an drain current of $I_D$=16 mA. From these parameters and a determined value of K from above, we find the small signal transconductance $g_m$ of the composite transistor as follows:

$$g_m = \sqrt{2 \cdot (1602 \cdot 10^{-3}) \cdot \left(\frac{32 \cdot 5 \text{ um}}{0.35 \text{ um}}\right) \cdot (16 \text{ mA})} = 0.153 \text{ S} = 153 \text{ mS}$$

The examples given above apply to CMOS processes. Similar circuits and analysis can be applied to other processes. For example, in a Silicon-Germanium (SiGe) or other bipolar process, circuits and methods along the lines of those described above may be used to sense/determine/analyze a base-to-emitter voltage and a collector current instead a gate-to-source voltage and a drain current.

VII. Example Operational Circuit

As mentioned above, process monitor 102 can be used to determine one or more process-based circuit parameters of IC chip 103. These process-based circuit parameters can then be used to determine operational circuit parameters of operational circuit 116.

Figure 6:
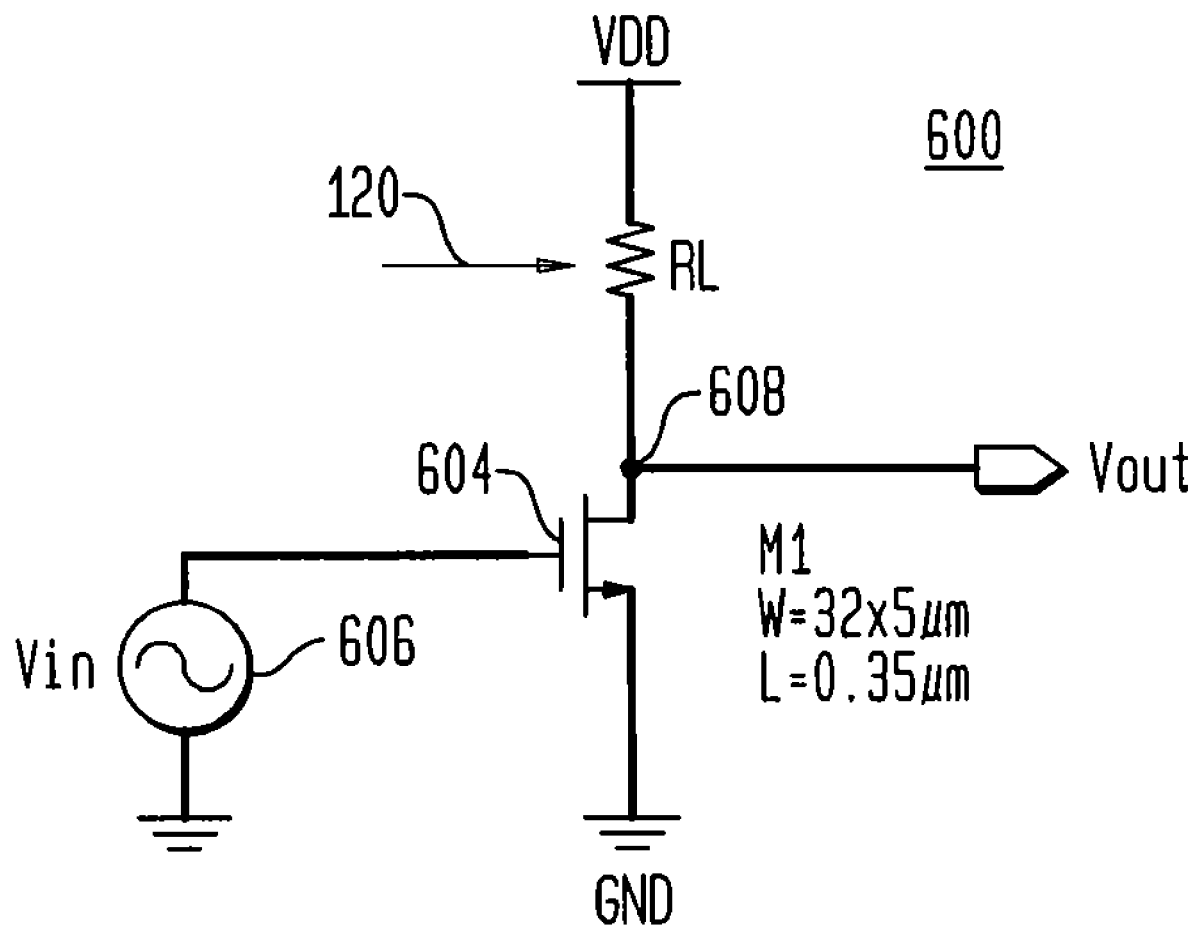
FIG. 6 is a circuit diagram of an exemplary amplifier of operational circuit of FIG. 1.

FIG. 6 is a circuit diagram of an exemplary amplifier 600, corresponding to operational circuit 116. Other types of circuits are contemplated. Amplifier 600 includes an NMOS transistor 604, constructed on IC chip 103, having a source connected to ground, a gate connected to a voltage source 606, and a drain 608 that produces an output signal Vout. Amplifier 600 includes a variable load resistor RL connected between drain 608 and a power supply rail at voltage VDD. Load resistor RL may be varied in accordance with control signal 120.

A transistor-based amplifier having a resistive load RL, has a voltage gain $A_v$ given by the following general expression:

$$A_v = g_m \cdot R_L \qquad \text{eq. (11)}$$

For amplifier 600, $g_m$ is the transconductance of transistor 604, and $R_L$ is the resistance of load resistor RL. Here, it is assumed that all resistors match in ratio on IC chip 103. Thus, resistor RL matches resistor R5 or R6 of FIG. 2. Therefore, the value of resistor RL can be determined from process monitor 102.

Using the values of (i) $g_m$, and (ii) resistance determined above, the voltage gain of amplifier 600 is determined as $$A_v = g_m \cdot R_L = (0.153) \cdot (55.17) = 8.441$$

Converting the voltage gain to units of dB:

$$A_{dB} = 20 \cdot \log_{10}(8.441) = 18.53 \text{ dB}$$

In example circuit 600, assume the nominal transconductance $g_m$ is equal to 130 milli-Siemens (where the unit Siemen=1/Ohm) and the nominal resistance is equal to 50 ohms. This gives a nominal voltage gain of 15 dB. From our knowledge of K and sheet-Rho, we see that the gain is 3 dB higher than nominal. circuit may be adjusted to return the gain to a nominal value. Alternatively, a decision to not adjust the gain may be made, and the determined gain of the circuit is recorded.

VIII. Method Flowcharts

Figure 7:
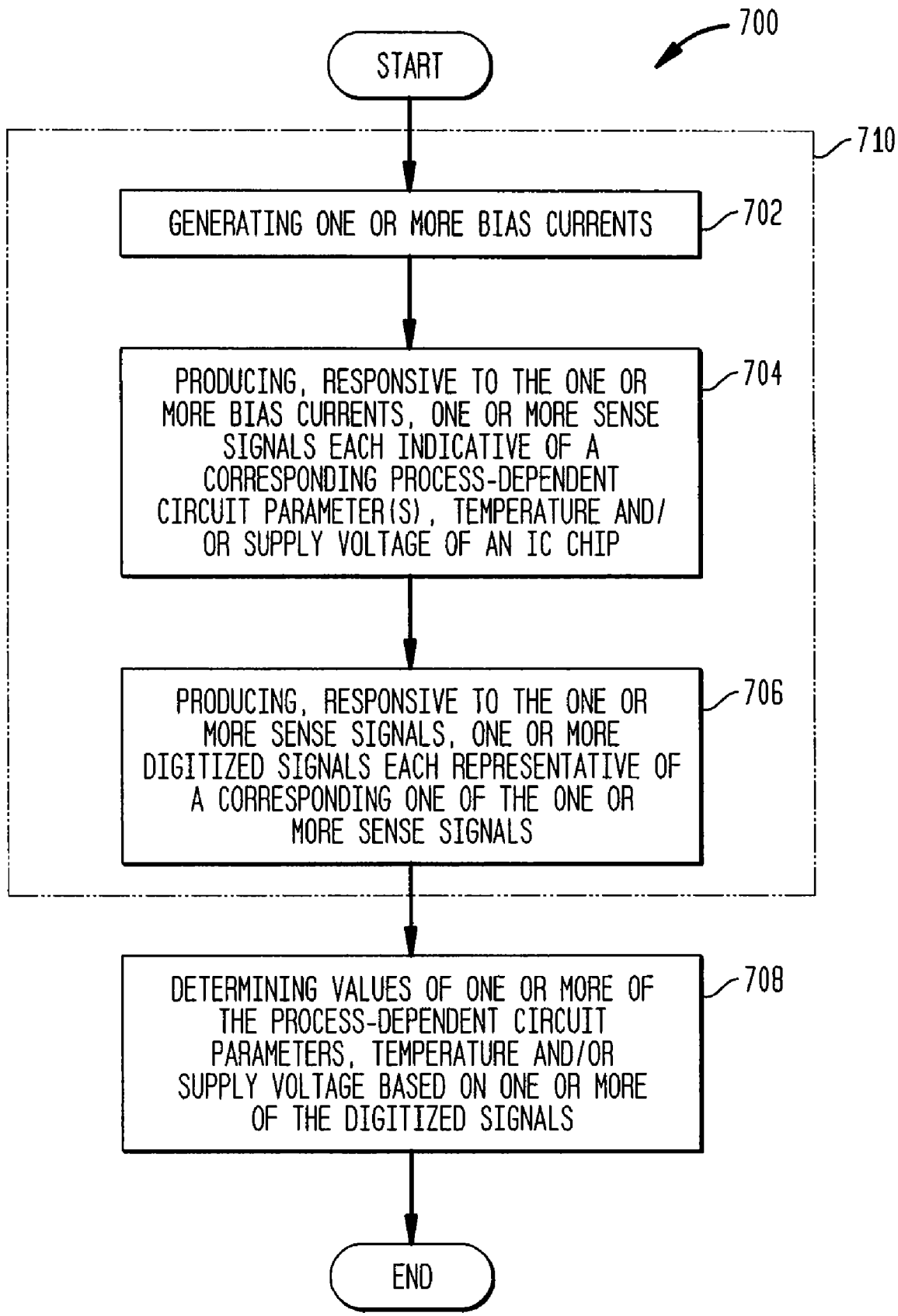
FIG. 7 is a flowchart of an example method that may be performed by the process monitor of FIG. 1.

FIG. 7 is a flowchart of an example method 700 that may be performed by process monitor 102. A first step 702 includes generating one or more bias currents. For example, bias circuit 104 generates one or more bias currents 118.

A next step 704 includes producing, responsive to the one or more bias currents, one or more sense signals each indicative of a corresponding process-dependent circuit parameter of an IC chip. For example, sense circuit 106 produces, responsive to the one or more bias currents 118, one or more sense signals 130 each indicative of a corresponding process-dependant circuit parameter of IC chip 103, a temperature of the IC chip, and a power supply voltage of the IC chip. Any subset of these sense signals may be produced in this step.

A next step 706 includes producing, responsive to the one or more sense signals, one or more digitized signals each representative of a corresponding one of the one or more sense signals. For example, digitizer module 166 produces digitized signal(s) 164 corresponding to sense signals 130.

Steps 702, 704 and 706 collectively represent a step of producing one or more digitized sense signals each representative of corresponding ones of one or more process-dependent circuit parameters, a temperature, and/or a power supply voltage of IC chip 103. Step 702 is optional, and may be omitted in an alternative arrangement of method 700. Process monitor module 182 may perform step 710.

A next step 708 includes determining values of one or more of the process-dependant circuit parameters, the IC chip temperature, and the power supply voltage of the IC chip, based on one or more of the digitized signals. For example, controller 114 determines values of the process-dependant circuit parameters, the temperature, and the power supply voltage based on digitized signal(s) 164.

Figure 8:
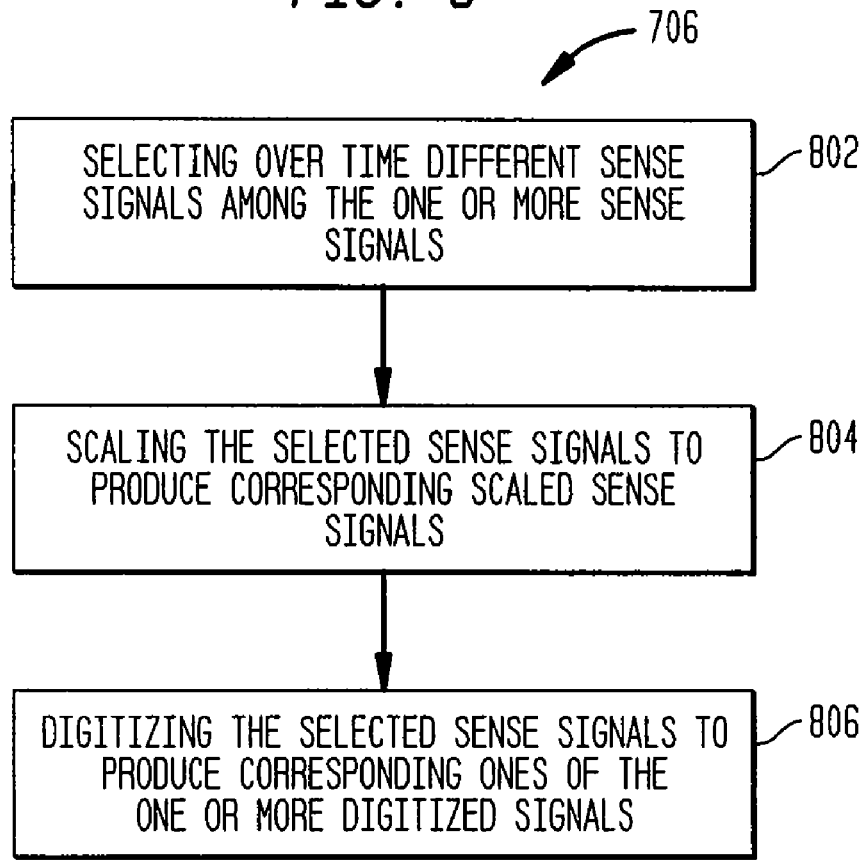
FIG. 8 is a flowchart of further method steps expanding on the method of FIG. 7.

FIG. 8 is a flowchart of further method steps performed in step 706 of method 700. Step 706 includes a further step 802. Step 802 includes selecting over time different sense signals among the one or more sense signals from step 704. For example, multiplexer 108 selects one of sense signals 130 responsive to control signals 124.

An optional next step 804 includes scaling the selected sense signals to produce corresponding scaled sense signals. For example, scaling amplifier 110 can perform this step.

A next step 806 includes digitizing the scaled, selected sense signals to produce corresponding ones of the one or more digitized signals. For example, digitizer 112 can perform this step.

Figure 9:
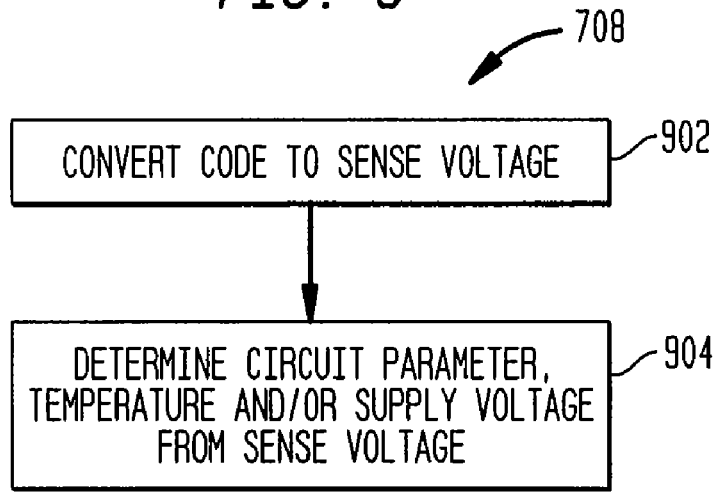
FIG. 9 is a flowchart of further method steps expanding on the method of FIG. 7.

FIG. 9 is a flowchart expanding on step 708 of method 700. A first step 902 includes converting a digitized code into a corresponding sense voltage of one of the sense signals. This may take into account scaling voltage $V_{SA}$. One or more of equations (1)-(3) may be used, for example. For example, controller 114 converts digitized code 164 to a corresponding sense voltage $V_{sense}$.

A next step 904 includes determining a value of a circuit parameter corresponding to the digitized code, based on the sense voltage $V_{sense}$. For example, controller 114 determines the value of the circuit parameter from the determined voltage $V_{sense}$. One or more of equations (4)-(10) may be used, for example. In addition or alternatively, a value of an IC chip temperature or power supply voltage may be determined in this step.

Steps 902 and 904 may be repeated to determine a circuit parameter, such as transconductance parameter K, that depends on other circuit parameters, such as gate-source threshold voltage $V_{TH}$.

IX. Controller Modules

Figure 10:
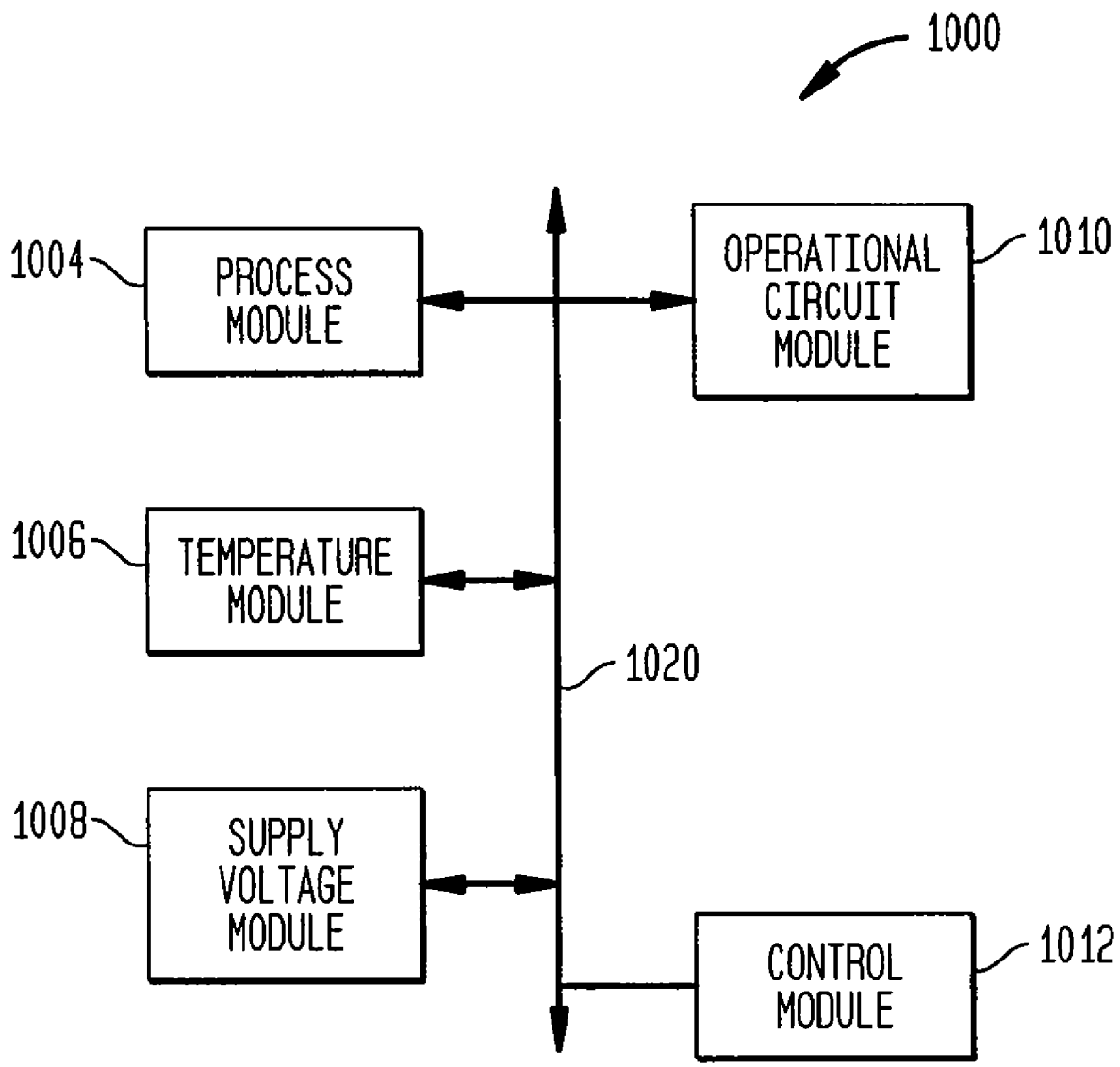
FIG. 10 is a block diagram of an example controller architecture for performing various functions and methods associated with embodiments of the present invention.

FIG. 10 is a block diagram of an example controller architecture 1000 for performing various functions and methods associated with embodiments of the present invention described above. Controller 1000 includes the following modules, which may be implemented in hardware, software, firmware, or a combination thereof:

a process module 1004 for determining values of process-dependent circuit parameters based on digitized sense signals indicative of the process-dependent parameters. Process module 1004 may include sub-modules each for determining a corresponding one of the process-dependent parameters, e.g., the transconductance parameter, the gate-to-source voltage, the resistivity, and so on;

a temperature module 1006 for determining a temperature value based on a digitized sense signal indicative of temperature;

a supply voltage module 1008 for determining a power supply voltage value based on a digitized sense signal indicative of the voltage;

an operational circuit control module 1010 for controlling/adjusting operational circuit 116 responsive to results produced by the other modules depicted in FIG. 10; and a control module 1012 for controlling process monitor 182, for example.

These modules intercommunicate over an interface or bus 1020.

X. Advantages

The process monitor provides a means for determining absolute circuit parameters, and/or a temperature the IC chip, and/or a power supply voltage (VDD) of the IC chip. Individual circuit elements may be adjusted based on the absolute circuit parameters.

The process monitor can be used with any integrated circuit process, such as CMOS, Silicon bipolar, GaAs, SiGe and InP processes.

An external processor is used to determine circuit parameters instead of relying on complicated analog correction circuits on the integrated circuit chip. The external processor is well-controlled.

The process monitor also provides a way to monitor process, supply voltage (VDD), temperature and other parameters to determine how manufacturing variations occur. Self-contained (i.e., on-chip) analog correction circuits provide no information to a manufacturing tester. Also, the process monitor provides digital words, which are more readily usable with an automated tester. For example, an automated tester can determine, from information received from the process monitor, whether a particular IC chip being monitored will be unable to meet circuit design specifications. An out-of-spec. IC chip can be discarded before other more costly tests are performed. Such information allows a foundry to "tweak" the process used in integrated circuit fabrication for best performance.

The process monitor is especially attractive in CMOS processes being used to make mixed-mode analog/digital circuits. Digital CMOS digital processes vary widely, but support complicated digital control circuitry. The use of the process monitor allows a designer to design simpler analog circuits that contain switch-able or re-configurable circuit elements that may be adjusted based on information provided by the process monitors.

The process monitor may be turned off after it is used, to save power. In contrast, analog correction circuits typically remain always on.

XI. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. For example, embodiments include a process monitor sense circuit and methods corresponding thereto, other embodiments include a process monitor sense circuit in combination with a digitizer or a digitizer module and methods corresponding thereto, further embodiments include a process monitor sense circuit in combination with a digitizer module and a controller and methods corresponding thereto, even further embodiments include an apparatus that produces digitized sense signals, an apparatus that produces digitized sense signals and a controller for processing the same and methods corresponding thereto, other embodiments include a process monitor module in combination with a controller and methods corresponding thereto, other embodiments include methods of determining values of process-dependent circuit parameters, a temperature, and a power supply voltage of an IC chip.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks and modules can be implemented by discrete components including digital and/or analog circuits, application specific integrated circuits, processors executing appropriate software, hardware, firmware and the like or any combination thereof. Thus, the breadth and scope of the present invention should not be limited by any of the above-described exemplary embodiments, but should be defined only in accordance with the following claims and their equivalents.

What is claimed is:

1. A system for monitoring an integrated circuit chip, comprising:
    a first circuit at least partially disposed on the integrated circuit chip and configured to produce a first signal, wherein the first signal is indicative of a measure of a manufacturing process-dependent circuit parameter of the integrated circuit chip; and
    a second circuit at least partially disposed on the integrated circuit chip and configured to produce a second signal, wherein the second signal is indicative of a measure of a temperature of the integrated circuit chip.

2. The system of claim 1, wherein the first circuit and the second circuit are fully disposed on the integrated circuit chip.

3. The system of claim 1, further comprising an analog multiplexer configured to multiplex the first signal and the second signal.

4. A system for monitoring an integrated circuit chip, comprising:
    a first circuit at least partially disposed on the integrated circuit chip and configured to produce a first signal, wherein the first signal is indicative of a measure of a manufacturing process-dependent circuit parameter of the integrated circuit chip; and
    a second circuit at least partially disposed on the integrated circuit chip and configured to produce a second signal, wherein the second signal is indicative of a measure of a power supply voltage of the integrated circuit chip.

5. The system of claim 4, wherein the first circuit and the second circuit are fully disposed on the integrated circuit chip.

6. The system of claim 4, further comprising an analog-to-digital converter configured to receive the first signal and the second signal and to produce a digital representation of the first signal and a digital representation of the second signal.

7. A system for monitoring an integrated circuit chip, comprising:
    a first circuit at least partially disposed on the integrated circuit chip and configured to produce a first signal, wherein the first signal is indicative of a measure of a temperature of the integrated circuit chip;
    a second circuit at least partially disposed on the integrated circuit chip and configured to produce a second signal, wherein the second signal is indicative of a measure of a power supply voltage of the integrated circuit chip; and
    a third circuit at least partially disposed on the integrated circuit chip and configured to produce a third signal, wherein the third signal is indicative of a measure of a manufacturing process-dependent circuit parameter of the integrated circuit chip.

8. The system of claim 7, wherein the first circuit and the second circuit are fully disposed on the integrated circuit chip.

9. The system of claim 7, further comprising a controller configured to receive the first signal and the second signal and to produce a fourth signal to cause an adjustment of an operation performed on the integrated circuit chip.

10. The system of claim 9, wherein the controller is disposed outside of the integrated circuit chip.

11. A system for monitoring an integrated circuit chip, comprising:
- a first sensor at least partially disposed on the integrated circuit chip and configured to produce a first signal, wherein the first signal is indicative of a measure of a first manufacturing process-dependent circuit parameter;
- a second sensor at least partially disposed on the integrated circuit chip and configured to produce a second signal, wherein the second signal is indicative of a measure of a second manufacturing process-dependent circuit parameter;
- an analog multiplexer configured to multiplex the first signal and the second signal; and
- an analog-to-digital converter configured to receive, from the analog multiplexer, the first signal and the second signal and to produce a digital representation of the first signal and a digital representation of the second signal.

12. The system of claim 11, wherein the first sensor, the second sensor, the analog multiplexer, and the analog-to-digital converter are fully disposed on the integrated circuit chip.

13. The system of claim 11, further comprising a controller configured to receive the digital representation of the first signal and the digital representation of the second signal and to produce a third signal to cause an adjustment of an operation performed on the integrated circuit chip.

14. The system of claim 11, wherein the first manufacturing process-dependent circuit parameter is a gate-to-source threshold voltage of a transistor disposed on the integrated circuit chip.

15. The system of claim 11, wherein the first manufacturing process-dependent circuit parameter is a transconductance of a transistor disposed on the integrated circuit chip.

16. The system of claim 11, wherein the first manufacturing process-dependent circuit parameter is a sheet resistance of a resistor disposed on the integrated circuit chip.

17. A system for monitoring an integrated circuit chip, comprising:
- a first circuit disposed on the integrated circuit chip and configured to determine a measure of a manufacturing process-dependent circuit parameter, to convert the measure of the manufacturing process-dependent circuit parameter into a first signal, and to communicate the first signal to a controller; and
- a second circuit disposed on the integrated circuit chip and configured to receive a second signal from the controller and to cause an adjustment of an operation performed on the integrated circuit chip, wherein the adjustment is in response to the measure of the manufacturing process-dependent circuit parameter.

18. The system of claim 17, wherein the first circuit and the second circuit are fully disposed on the integrated circuit chip.

19. The system of claim 17, wherein the controller is disposed outside of the integrated circuit chip.

20. The system of claim 17, wherein the adjustment is a change to a resistance of a part of a circuit that realizes the operation performed.

* * * * *